United States Patent

Beran et al.

(10) Patent No.: US 11,402,439 B2
(45) Date of Patent: Aug. 2, 2022

(54) METHOD FOR CALIBRATING THE SENSITIVITY OF MONOAXIAL OR MULTIAXIAL MAGNETIC FIELD SENSORS

(71) Applicant: Fraunhofer-Gesellschaft zur Foerderung der angewandten Forschung e.V., Munich (DE)

(72) Inventors: Philip Beran, Erlangen (DE); Volker Peters, Erlangen (DE); Gerhard Tischlinger, Erlangen (DE)

(73) Assignee: FRAUNHOFER-GESELLSCHAFT ZUR FOERDERUNG DER ANGEWANDTEN FORSCHUNG E.V, Munich (DE)

( * ) Notice: Subject to any disclaimer, the term of this patent is extended or adjusted under 35 U.S.C. 154(b) by 0 days.

(21) Appl. No.: 17/381,626

(22) Filed: Jul. 21, 2021

(65) Prior Publication Data
US 2022/0026505 A1    Jan. 27, 2022

(30) Foreign Application Priority Data

Jul. 23, 2020 (DE) .......................... 102020119432.3

(51) Int. Cl.
*G01R 33/00* (2006.01)
*G01R 33/02* (2006.01)

(52) U.S. Cl.
CPC ..... *G01R 33/0017* (2013.01); *G01R 33/0094* (2013.01); *G01R 33/0206* (2013.01)

(58) Field of Classification Search
CPC ............ G01R 33/0035; G01R 33/0094; G01R 33/0206
See application file for complete search history.

(56) References Cited

U.S. PATENT DOCUMENTS

| 4,109,199 | A | 8/1978 | Ball et al. |
| 10,895,611 | B1 * | 1/2021 | Opperman ............. G01C 17/38 |

(Continued)

FOREIGN PATENT DOCUMENTS

| DE | 60206973 T2 | 7/2006 |
| EP | 3315983 A1 | 5/2018 |

OTHER PUBLICATIONS

English translation of German (DE) Examination Report (1 page) dated Jul. 20, 2021 providing relevance of cited prior art.

(Continued)

*Primary Examiner* — Alvaro E Fortich
(74) *Attorney, Agent, or Firm* — Renner, Kenner, Greive, Bobak, Taylor & Weber

(57) ABSTRACT

In a method for calibrating the sensitivity of a monoaxial or multiaxial magnetic field sensor, the magnetic field sensor is exposed consecutively to at least three magnetic fields having different magnetic field vectors which may be freely orientated in space so that they span an oblique coordinate system. The magnetic fields are measured with the magnetic field sensor in order to obtain a sensitivity vector in the oblique coordinate system of the magnetic field vectors for each sensor axis. The sensitivity vectors are transformed into an orthogonal coordinate system via a transformation matrix, and sensitivity and transverse sensitivity of each sensor axis are then calculated on the basis of the transformed sensitivity vectors either directly or following a further transformation. The method enables rapid, precise calibration of all sensitivities of a magnetic field sensor, since it does not require any orthogonal magnetic fields.

6 Claims, 1 Drawing Sheet

(56) References Cited

U.S. PATENT DOCUMENTS

2008/0129282 A1    6/2008  Lemp
2017/0356966 A1*  12/2017  Romero ............. G01R 33/0017
2019/0265324 A1*  8/2019  Bilbao De Mendizabal ...............
                                                        G01R 33/07
2019/0339337 A1*  11/2019  Sharma ................ G01R 33/098

OTHER PUBLICATIONS

Torben Risbo et al., "Ørsted pre-flight magnetometer calibration mission," Meas. Sci. Technol. 14 (2003), pp. 674-688.
J.M.G. Merayo et al., "The orthogonalization of magnetic systems," Sensors & Actuators A 89 (2001), pp. 185-196.

\* cited by examiner

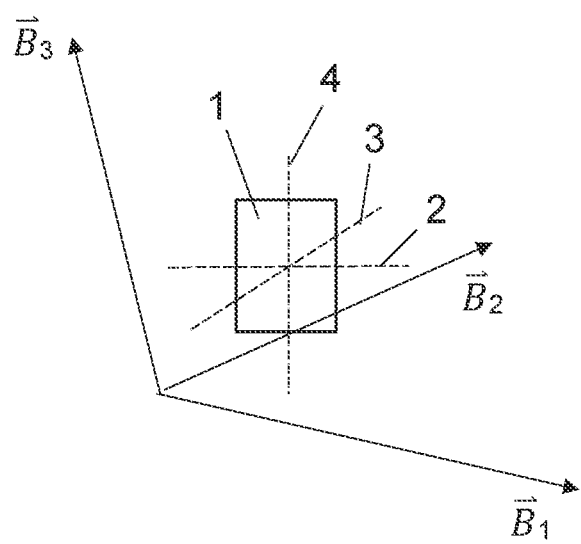

METHOD FOR CALIBRATING THE SENSITIVITY OF MONOAXIAL OR MULTIAXIAL MAGNETIC FIELD SENSORS

TECHNICAL FIELD

The present invention relates to a method for calibrating the sensitivity of a monoaxial or multiaxial magnetic field sensor, in which the magnetic field sensor is exposed consecutively to at least three magnetic fields having different magnetic field vectors which do not lie in a plane relative to a reference system that is connected fixedly to the magnetic field sensor, and the magnetic fields are measured with the magnetic field sensor for each sensor axis of the magnetic field sensor in order to obtain a sensitivity vector for each sensor axis.

Multiaxial magnetic field sensors exist in a number of variants; for example, 3-D or Tri-Axis magnetic field sensors have three sensor axes, which are ideally orientated orthogonally with respect to each other. Magnetic field sensors are associated with numerous measurement inaccuracies, which adversely affect the measurement result. These are not limited to just usual sensor errors relating to signal offset and sensitivity. In multiaxial sensors there are also transverse sensitivities between the sensor axes which are attributable to tolerances regarding orthogonality during the manufacture and installation of the sensors. Since the sensor axes have a certain degree of undefined orientation in space, they must be calibrated both in respect of their relative position in space and with regard to the transverse sensitivity between the individual axes in order to correct a further distortion of the sensor signal.

RELATED ART

For the purpose of calibrating multiaxial magnetic field sensors, there are already methods designed to determine the sensitivities of the sensor axes and the transverse sensitivities between the sensor axes, i.e. sensitivity to magnetic fields perpendicularly to the sensor axes. The known methods are based either on elaborate rotations of the magnetic field sensors about one or more axes in homogeneous magnetic fields, or on the generation of known homogeneous magnetic fields in an orthogonal coil system. Thus for example, Torben Risbo et al., "Ørsted pre-flight magnetometer calibration mission", Meas. Sci. Technol. 14 (2003), pages 674 to 688, present a method for calibration on the basis of orthogonal magnetic fields and an apparatus for generating the orthogonal magnetic fields. J. M. G. Merayo et al., "The orthogonalization of magnetic systems" Sensors & Actuators A 89 (2001), pages 185 to 196, also present an apparatus for generating orthogonal magnetic fields for the purpose of calibrating magnetic field sensors.

However, the known methods are either difficult to manage with regard to the demands they place on the mechanical system, and they require relatively long measurement times, which can last up to several hours, or they require complicated analysis based on optimisation and fit algorithms which consequently does not allow a conclusive statement to be made about the accuracy of the calibration.

The problem addressed by the present invention consists in describing a method for calibrating the sensitivity and transverse sensitivity of monoaxial or multiaxial magnetic field sensors which enables rapid, precise calibration of all sensitivities of the magnetic field sensors as well as a determination regarding the accuracy of the calibration.

SUMMARY OF THE INVENTION

The problem is solved with the method according to Patent Claim 1. Advantageous variants of the method are subject matter of the dependent claims or may be discerned from the following description and the exemplary embodiment.

In the suggested method, the magnetic field sensor is exposed consecutively to at least three magnetic fields having different magnetic field vectors, which do not lie in a plane relative to a reference system that is connected fixedly to the magnetic field sensor, that is to say they are linearly independent and span an oblique coordinate system. The magnetic fields must be known with regard to flux density and/or field strength and their position relative to each other. The flux densities of the magnetic fields and/or the values of the magnetic field vectors may be known either at a specific location or in a homogeneous region. For the subsequent measurement, the magnetic field sensor is positioned at this specific location or in this homogeneous region. A magnetic field with a known magnetic field vector can be generated at a specific location for example by permanent magnets, coils or other current-carrying conductors, a magnetic field with a known magnetic field vector can be generated in a homogeneous region for example by one or more nested Helmholtz coils or various other coil systems that produce homogeneous magnetic fields. The magnetic fields are measured with the magnetic field sensor for each sensor axis of the magnetic field sensor, to obtain a sensitivity vector in the oblique coordinate system of the magnetic field vectors for each sensor axis. In order to determine the sensitivity of the magnetic field sensor, a transformation matrix is then created, with which a vector in the oblique coordinate system that is spanned by the magnetic field vectors can be translated into an orthogonal coordinate system. The sensitivity vectors are transformed into the orthogonal coordinate system with the aid of the transformation matrix, and sensitivity and transverse sensitivity of each sensor axis of the magnetic field sensor are calculated on the basis of the transformed sensitivity vectors. In this context, the calculation may be carried out either directly from said transformed sensitivity vectors or if necessary after further conversion of these sensitivity vectors.

Accordingly, the suggested method does not necessitate the generation of any orthogonal magnetic fields. Instead, the method only requires the generation of at least three linearly independent, known magnetic fields with arbitrary orientation in space, and an analytical calculation of the sensitivity and transverse sensitivity calibration parameters, and optionally a determination of the measurement uncertainties of these calibration parameters. In such a case, it must be possible to generate the magnetic fields sequentially, that is to say independently of each other, so that a unique measurement value can be assigned to each magnetic field. The three independent magnetic fields may be generated for example with a triaxial coil system or by rotating the magnetic field relative to the sensor or by rotating the magnetic field sensor in a static magnetic field.

Preferably, neither the sensor nor an arrangement for generating the magnetic fields is rotated mechanically. Rather, the magnetic fields are preferably generated by a suitable static apparatus, for example several nested Helmholtz coils. In practice, three magnetic fields are sufficient. However, additional magnetic fields may also be generated and measured. But if more than three magnetic fields are used the analysis becomes considerably more complicated and does not deliver any further information about the magnetic field sensor that is to be calibrated.

The use of magnetic fields with (almost) any orientation in space means that no effort must be expended to generate orthogonal magnetic fields. Even complex rotations of the magnetic field sensors for exact orientation in order to create magnetic fields which are orthogonal to each other at the location of the magnetic field sensor, are not needed in the suggested method. In the suggested method, the exact location of the magnetic field sensor relative to the magnetic fields is unimportant. The analytical calculation of the calibration parameters renders approximation procedures unnecessary, thereby enabling the accuracy of the calibration to be determined.

In a preferred variant of the suggested method, the angles between the sensor axes of the magnetic field sensor are also calculated from the transformed sensitivity vectors. This makes it possible to precisely determine the mutual positions of the sensor axes. If the sensor axes are not aligned perpendicularly to each other as desired, preferably a second transformation matrix is created, with which a vector in an oblique coordinate system spanned by the transformed sensitivity vectors may in turn be translated into an orthogonal coordinate system. The transformation matrix for translating into a second coordinate system may thus be chosen such that not only is the orthogonality of the sensor axes corrected, but the location of the sensor coordinate system relative to an external reference system is also adjusted. The transformed sensitivity vectors are then transformed into this orthogonal coordinate system, which has been corrected relative to location, with the aid of the second transformation matrix, so that a corrected sensitivity and transverse sensitivity can then be calculated for each sensor axis from the re-transformed sensitivity vectors. This makes it possible to fully correct any subsequent measurement value of the monoaxial or multiaxial magnetic field sensor.

With the suggested method, it is also possible to calibrate several monoaxial or multiaxial magnetic field sensors at the same time, by exposing not just one of the magnetic field sensors but multiple magnetic field sensors to the respective magnetic field simultaneously. In this way corresponding sensitivity vectors are obtained for each of these magnetic field sensors, and these are then transformed into the orthogonal coordinate system with the aid of the transformation matrix and used to calculate sensitivity and transverse sensitivity for each sensor axis of the respective magnetic field vector. This simultaneous measurement and calibration can be carried out particularly in a variant in which the magnetic fields can be generated homogeneously in a corresponding region.

BRIEF DESCRIPTION OF THE DRAWINGS

In the following text, the suggested method will be explained again, in greater detail, with reference to an exemplary embodiment and in conjunction with the FIGURE, wherein FIG. 1 shows a schematic representation of an exemplary orientation of three linearly independent magnetic fields and three sensor axes of a triaxial magnetic field sensor in the suggested method.

WAYS TO IMPLEMENT THE INVENTION

In the following, the suggested method will be explained again for exemplary purposes by means of the calibration of a triaxial magnetic field sensor using three magnetic fields or magnetic field vectors which are orientated freely in space. In the case of three magnetic fields for the calibration, the values for the flux densities of the three magnetic fields $B_1$, $B_2$ and $B_3$ as well as the angles between the magnetic fields or magnetic field vectors $w_{B1B2}$, $w_{B2B3}$ and $w_{B3B1}$ must be known. To this end, FIG. 1 shows an example of an orientation of the three magnetic field vectors.

The location and strength of the magnetic fields can also be expressed in vector notation:

$$\vec{B_1} = B_1 \cdot \vec{g_1}, \vec{B_2} = B_2 \cdot \vec{g_2}, \vec{B_3} = B_3 \cdot \vec{g_3}$$

In this context, $\vec{g_1}$, $\vec{g_2}$ and $\vec{g_3}$ represent the "base vectors" of a coordinate system of the magnetic fields, which correspond to the directions of the magnetic fields.

The field vectors may be freely orientated in space, although the angles between the fields must be known. Therefore, the following applies:

$$\cos(w_{B1B2}) = \frac{\vec{B_1} \cdot \vec{B_2}}{|\vec{B_1}| \cdot |\vec{B_2}|}; \cos(w_{B2B3}) = \frac{\vec{B_2} \cdot \vec{B_3}}{|\vec{B_2}| \cdot |\vec{B_3}|}; \cos(w_{B3B1}) = \frac{\vec{B_3} \cdot \vec{B_1}}{|\vec{B_3}| \cdot |\vec{B_1}|}$$

The quantity of the vectors $\vec{g_1}$, $\vec{g_2}$ and $\vec{g_3}$ may also be interpreted as basis $\hat{g}$ of the oblique coordinate system which is spanned by the three magnetic fields. Expressed in a Cartesian (orthogonal) coordinate system $\hat{e}$ with base vectors $\vec{e_1}$, $\vec{e_2}$ and $\vec{e_3}$, the location of the oblique coordinate system can be defined relative to the Cartesian system as follows: $\vec{g_1}$ is parallel to $\vec{e_1}$, $\vec{g_2}$ is in the plane of $\vec{e_1}$ and $\vec{e_2}$, $\vec{g_3}$ is situated anywhere in space:

$$\vec{g_1} = \begin{pmatrix} x_1 \\ 0 \\ 0 \end{pmatrix}, \vec{g_2} = \begin{pmatrix} x_2 \\ y_2 \\ 0 \end{pmatrix}, \vec{g_3} = \begin{pmatrix} x_3 \\ y_3 \\ z_3 \end{pmatrix}$$

With a fixed length of base vectors $|\vec{g_1}|=|\vec{g_2}|=|\vec{g_3}|=1$, the equations for the angles between the magnetic field vectors may also be written as follows:

$$\cos(w_{B1B2}) = \vec{g_1} \cdot \vec{g_2}, \cos(w_{B2B3}) = \vec{g_2} \cdot \vec{g_3}, \cos(w_{B3B1}) = \vec{g_3} \cdot \vec{g_1}$$

After these three equations are resolved according to the components of the base vectors, they can be expressed as follows:

$$\vec{g_1} = \begin{pmatrix} 1 \\ 0 \\ 0 \end{pmatrix}; \vec{g_2} = \begin{pmatrix} \cos(w_{B1B2}) \\ \sin(w_{B1B2}) \\ 0 \end{pmatrix};$$

$$\vec{g_3} = \begin{pmatrix} \cos(w_{B3B1}) \\ \frac{\cos(w_{B2B3})}{\sin(w_{B1B2})} - \cot(w_{B1B2}) \cdot \cos(w_{B3B1}) \\ \sqrt{\sin^2(w_{B3B1}) - \left(\frac{\cos(w_{B2B3})}{\sin(w_{B1B2})} - \cot(w_{B1B2}) \cdot \cos(w_{B3B1})\right)^2} \end{pmatrix}$$

In order to effect a change of basis between an orthogonal coordinate system and the oblique coordinate system of the magnetic fields, the following transformation matrix $\underline{T}_{\hat{e}}^{\hat{g}}$ may be formed from the base vectors for transformation from ê to ĝ:

$$T_{\hat{e}}^{\hat{g}} = (\vec{g_1}\ \vec{g_2}\ \vec{g_3})^T = \begin{pmatrix} 1 & 0 & 0 \\ \cos(w_{B^1B^2}) & \sin(w_{B^1B^2}) & 0 \\ \cos(w_{B^3B^1}) & \frac{\cos(w_{B^2B^3})}{\sin(w_{B^1B^2})} - \cot(w_{B^1B^2}) \cdot \cos(w_{B^3B^1}) & \sqrt{\sin^2(w_{B^3B^1}) - \left(\frac{\cos(w_{B^2B^3})}{\sin(w_{B^1B^2})} - \cot(w_{B^1B^2}) \cdot \cos(w_{B^3B^1})\right)^2} \end{pmatrix}$$

This transformation is applied to vectors of basis ê: ĝ= $\underline{T}_{\hat{e}}^{\hat{g}} \cdot$ ê

For the inverse transformation from the oblique to the Cartesian system, the inverse of the matrix must be applied to the basis ĝ: ê=$\underline{T}_{\hat{e}}^{\hat{g}^{-1}} \cdot$ ĝ=$\underline{T}_{\hat{g}}^{\hat{e}} \cdot$ ĝ

The inverse of the matrix can be calculated by several different methods. One possible representation of the inverse is shown below:

$$T_{\hat{e}}^{\hat{g}} = T_{\hat{e}}^{\hat{g}^{-1}} = \begin{pmatrix} 1 & 0 & 0 \\ -\cot(w_{B^1B^2}) & \frac{1}{\sin(w_{B^1B^2})} & 0 \\ \frac{\cot(w_{B^1B^2}) \cdot F_Z - \cos(w_{B^3B^1})}{F_N} & \frac{-1}{\sin(w_{B^1B^2})} \cdot \frac{F_Z}{F_N} & \frac{1}{F_N} \end{pmatrix}$$

with $F_Z = $ $\frac{\cos(w_{B^2B^3})}{\sin(w_{B^1B^2})} - \cot(w_{B^1B^2}) \cdot \cos(w_{B^3B^1})$ and $F_N = \sqrt{\sin^2(w_{B^3B^1}) - F_Z^2}$ With $\underline{T}_{\hat{g}}^{\hat{e}}$ it is now possible to transform vectors from the base system of the magnetic fields which is freely orientated in space into a Cartesian coordinate system. In Cartesian coordinates, it is a simple matter to carry out analytical calculations of sensitivities.

In order to carry out the calibration, in the suggested method the measurement focus of one or more monoaxial or multiaxial measuring magnetic field sensors, in the present example of a triaxial magnetic field sensor, is brought to a specific place where the spatial position or alignment of the magnetic field vectors and the strength of the magnetic fields are known. In this situation the precise location of the magnetic field sensor is not important. It must only be ensured that the magnetic field vectors (value and direction) are known exactly at the site of the magnetic field sensor or the sensor volume. To this end, FIG. 1 shows an example of an (arbitrary) orientation of the magnetic field vector 1 with the three sensor axes 2, 3, 4 to the three magnetic fields or magnetic field vectors $\vec{B_1}$, $\vec{B_2}$, $\vec{B_3}$.

The suggested method is based on the reconstruction of a sensitivity vector for each monoaxial or multiaxial magnetic field sensor in the the freely orientated coordinate system of the magnetic fields. The offsets for the sensors must be known or else eliminated metrologically. This may be done for example by direct measurement of the offsets in a space where there are no magnetic fields (in a zero Gauss chamber, for example), or by eliminating the offsets through differential measurement. In the calibration of a triaxial magnetic field sensor with three magnetic fields carried out in the present example, the following vector for the sensitivity of the magnetic field sensor or a sensor axis can be constructed from the offset-free sensor measurement values $O_1$, $O_2$, $O_3$, relative to the basis ĝ of the magnetic fields by sequential application and measurement of the three magnetic fields $B_1$, $B_2$, $B_3$ resulting therefrom:

$$\vec{S_{\hat{g}}} = \begin{pmatrix} E_1 \\ E_2 \\ E_3 \end{pmatrix} = \begin{pmatrix} \frac{O_1}{B_1} \\ \frac{O_2}{B_2} \\ \frac{O_3}{B_3} \end{pmatrix}$$

Such a vector may now be generated for any further sensor axis of the magnetic field vector—and in general of multiple magnetic field sensors for any sensor axis of any of the magnetic field sensors —, thereby returning an abundance of n sensitivity vectors (in the present example n=3): $\underline{S}_{\hat{g}}^1 \ldots \underline{S}_{\hat{g}}^1$ To enable further calculation, these vectors are transformed into a Cartesian coordinate system with the aid of the previously defined inverses of the transformation matrix:

$$\vec{S\hat{e}} = \underline{T}_{\hat{g}}^{\hat{e}} \cdot \vec{S\hat{g}}$$

In the Cartesian coordinate system, the sensitivity of the respective sensor or the respective sensor axis can now be calculated using absolute value formation or determination of the norm of the sensitivity vector thereof, regardless of its individual alignment in the magnetic field. Thus, for each sensor axis 1 to n a correction factor for sensitivity is obtained:

$$K_1 = \frac{1}{|\vec{S_{\hat{e}}^1}|} \ldots K_n = \frac{1}{|\vec{S_{\hat{e}}^n}|}$$

Since the respective sensitivity vector also indicates the alignment of the sensor axis and therewith the location of the sensor axes relative to each other, the number of all angles ($_2^n$) between the n sensor axes can be determined using scalar product and cosine:

$$w_{S^1S^2} = \arccos\frac{\vec{S_{\hat{e}}^1} \cdot \vec{S_{\hat{e}}^2}}{|\vec{S_{\hat{e}}^1}| \cdot |\vec{S_{\hat{e}}^2}|} \ldots w_{S^{n-1}S^n} = \arccos\frac{\vec{S_{\hat{e}}^{n-1}} \cdot \vec{S_{\hat{e}}^n}}{|\vec{S_{\hat{e}}^{n-1}}| \cdot |\vec{S_{\hat{e}}^n}|}$$

In the case of a triaxial magnetic field sensor, as in the present example which returns the measurement values $M_1$, $M_2$, $M_3$, analogue to the oblique coordinate system of the magnetic fields a skewed sensor basis ŝ is obtained with the three base vectors $\vec{S_{\hat{e}}^1}$, $\vec{S_{\hat{e}}^2}$ and $\vec{S_{\hat{e}}^3}$ and the three associated angles $w_{S^1S^2}$, $w_{S^2S^3}$ and $w_{S^3S^1}$. This basis is translated into a Cartesian coordinate system using the known inverse of the transformation matrix: ê=$\underline{T}_{\hat{s}}^{\hat{e}} \cdot$ ŝ

It is then possible to decide freely which position the three sensor axes will assume in an orthogonal system. For example, the following variant is chosen here: $\vec{S_{\hat{e}}^1}$ is parallel to $\vec{e_1}$, $\vec{S_{\hat{e}}^2}$ lies in the plane of $\vec{e_1}$ and $\vec{e_2}$, $\vec{S_{\hat{e}}^3}$ is freely located in space. The transformation matrix $\underline{T}_{\hat{s}}^{\hat{e}}$ then appears as follows:

$$\underline{T}_{\hat{s}}^{\hat{e}} = \begin{pmatrix} 1 & 0 & 0 \\ -\cot(w_{\hat{s}1\hat{s}2}) & \dfrac{1}{\sin(w_{\hat{s}1\hat{s}2})} & 0 \\ \dfrac{\cot(w_{\hat{s}1\hat{s}2}) \cdot F_Z - \cot(w_{\hat{s}3\hat{s}1})}{F_N} & \dfrac{-1}{\sin(w_{\hat{s}1\hat{s}2})} \cdot \dfrac{F_Z}{F_N} & \dfrac{1}{F_N} \end{pmatrix}$$

with $F_Z =$ $\dfrac{\cos(w_{\hat{s}2\hat{s}3})}{\sin(w_{\hat{s}1\hat{s}2})} - \cot(w_{\hat{s}1\hat{s}2}) \cdot \cos(w_{\hat{s}3\hat{s}1})$ and $F_N = \sqrt{\sin^2*(w_{\hat{s}3\hat{s}1}) - F_Z^2}$ After translating the oblique triaxial sensor basis into an orthogonal coordinate system, it is possible to state the magnetic field vector in fully corrected form, i.e. sensitivity-corrected and in an orthogonal coordinate system. For this purpose, the correction values for the sensitivity are summarised in a diagonal matrix:

$$\underline{K}_{\hat{s}} = \begin{pmatrix} K_1 & 0 & 0 \\ 0 & K_2 & 0 \\ 0 & 0 & K_3 \end{pmatrix}$$

With this correction matrix and the known transformation matrix, a measurement value for the triaxial sensor $$\vec{M}_{\hat{s}} = \begin{pmatrix} M_1 \\ M_2 \\ M_3 \end{pmatrix}$$

can now be fully corrected, wherein transformation matrix $\underline{T}_{\hat{s}}^{\hat{e}}$ and correction matrix $\underline{K}_{\hat{s}}$ can also be compiled as a combined correction matrix $\underline{C}_{\hat{s}}^{\hat{e}} = \underline{T}_{\hat{s}}^{\hat{e}} \cdot \underline{K}_{\hat{s}}$:

$\vec{M}_{\hat{e}} = \underline{T}_{\hat{s}}^{\hat{e}} \cdot \underline{K}_{\hat{s}} \cdot \vec{M}_{\hat{s}} = \underline{C}_{\hat{s}}^{\hat{e}} \cdot \vec{M}_{\hat{s}}$

The invention claimed is:

1. Method for calibrating the sensitivity of at least one monoaxial or multiaxial magnetic field sensor, comprising:
    the magnetic field sensor (1) is exposed consecutively to at least three magnetic fields (B1, B2, B3) having different magnetic field vectors, which do not lie in a plane relative to a reference system that is connected fixedly to the magnetic field sensor (1) and which span an oblique coordinate system,
    the magnetic fields (B1, B2, B3) are measured with the magnetic field sensor (1) for each sensor axis (2, 3, 4) of the magnetic field sensor (1), in order to obtain a sensitivity vector in the oblique coordinate system of the magnetic field for each sensor axis (2, 3, 4),
    a transformation matrix is created, with which a vector in the oblique coordinate system spanned by the magnetic field, vectors can be translated into an orthogonal coordinate system,
    the sensitivity vectors are transformed into the orthogonal coordinate system with the aid of the transformation matrix, and
    sensitivity and transverse sensitivity of each sensor axis (2, 3, 4) are calculated from the transformed sensitivity vectors either directly or after a further transformation.

2. Method according to claim 1, characterized in that angles between the sensor axes (2, 3, 4) are calculated from the transformed sensitivity vectors.

3. Method according to claim 1 or 2, characterized in that in the event that the angles between the sensor axes (2, 3, 4) differ from 90°, a second transformation matrix is created, with which a vector in a second oblique coordinate system spanned by the transformed sensitivity vectors can be translated into a second orthogonal coordinate system, the transformed sensitivity vectors are transformed into the second orthogonal coordinate system with the aid of the second transformation matrix, and
    a corrected sensitivity and transverse sensitivity of each sensor axis (2, 3, 4) is calculated from the sensitivity vectors that have been transformed into the second orthogonal coordinate system.

4. Method according to any one of claims 1 to 3, characterized in that
    the magnetic fields ($B_1$, $B_2$, $B_3$) are generated with a device for generating homogeneous magnetic fields.

5. Method according to any one of claims 1 to 3, characterized in that
    the magnetic fields ($B_1$, $B_2$, $B_3$) are generated with one or more nested Helmholtz coils.

6. Method according to any one of claims 1 to 5 for calibrating the sensitivity of multiple monoaxial or multiaxial magnetic field sensors, in which the monoaxial or multiaxial magnetic field sensors (1) are exposed together to the at least three magnetic fields ($B_1$, $B_2$, $B_3$), and the magnetic fields ($B_1$, $B_2$, $B_3$) are measured with the magnetic field sensors (1) for each sensor axis (2, 3, 4) of the magnetic field sensors (1).

* * * * *